United States Patent
Wu et al.

(10) Patent No.: US 7,496,159 B2
(45) Date of Patent: Feb. 24, 2009

(54) SURVIVOR MEMORY MANAGEMENT IN A VITERBI DECODER

(75) Inventors: Kuo-Ming Wu, Hsinchu (TW); Shih-Chung Yin, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 718 days.

(21) Appl. No.: 10/724,915

(22) Filed: Dec. 1, 2003

(65) Prior Publication Data

US 2005/0117673 A1  Jun. 2, 2005

(51) Int. Cl.
*H03D 1/00* (2006.01)
(52) U.S. Cl. .................. 375/341; 375/262; 714/794; 714/795
(58) Field of Classification Search .......... 375/341, 375/262, 316, 340; 714/286, 794, 795
See application file for complete search history.

(56) References Cited

U.S. PATENT DOCUMENTS

| | | | | |
|---|---|---|---|---|
| 5,878,092 A * | 3/1999 | Choi | ............... | 375/341 |
| 5,923,713 A * | 7/1999 | Hatakeyama | ............... | 375/341 |
| 6,163,581 A * | 12/2000 | Kang | ............... | 375/341 |
| 6,259,749 B1 * | 7/2001 | Andoh | ............... | 375/341 |
| 6,324,226 B1 * | 11/2001 | Sasagawa | ............... | 375/341 |
| 6,760,438 B1 * | 7/2004 | Hui et al. | ............... | 380/28 |
| 6,788,750 B1 * | 9/2004 | Reuven et al. | ............... | 375/341 |
| 6,883,021 B2 * | 4/2005 | Ahmed et al. | ............... | 709/213 |
| 2002/0083396 A1 * | 6/2002 | Azadet et al. | ............... | 714/796 |
| 2002/0095639 A1 * | 7/2002 | Ahmed et al. | ............... | 714/786 |
| 2002/0122503 A1 * | 9/2002 | Agazzi | ............... | 375/316 |
| 2005/0105658 A1 * | 5/2005 | Haratsch | ............... | 375/348 |
| 2006/0114981 A1 * | 6/2006 | Ghosh et al. | ............... | 375/232 |

* cited by examiner

*Primary Examiner*—David C Payne
*Assistant Examiner*—Leila Malek
(74) *Attorney, Agent, or Firm*—Thomas, Kayden, Horstemeyer & Risley

(57) ABSTRACT

An apparatus for survivor path decoding in a Viterbi decoder with a constraint length of K. The apparatus of the invention includes a best survivor unit, a a register-exchange network, and a trace-back unit. The best survivor unit receives path metrics of $2^{K-2}$ local winner states from which a best state is selected every L iterations. Meanwhile, the register-exchange network generates decision vectors of survivor paths leading to $2^{K-1}$ states at instant i according to decision bits of all states from instant i–L to instant i. Every L iterations the register-exchange network outputs L-bit decision vectors for all states at instant i. Then the trace-back unit stores the decision vectors and finds a global survivor path sequence by following the decision vectors back from the best state at instant i–L. In this manner, L decoded bits can be output from the trace-back unit every L iterations.

14 Claims, 6 Drawing Sheets

US 7,496,159 B2

SURVIVOR MEMORY MANAGEMENT IN A VITERBI DECODER

BACKGROUND OF THE INVENTION

1. Field of the Invention

The invention relates to digital communication systems, and more particularly to branch metric computation and add-compare-select operation in Viterbi decoders.

2. Description of the Related Art

In wired and wireless applications, especially wireless LAN (WLAN), finite signal and noise powers lead to a strong probability that any bit in any message may be corrupted. These corrupted bits incur errors in wireless transmission, causing troubles like lower data rates or lost transmissions. Forward error correction (FEC) techniques have been developed to account and correct for corrupted bits. The purpose of FEC is to improve the capacity of a channel by adding some carefully designed redundant information to the data being transmitted through the channel. The process of adding this redundant information is known as channel coding. Convolutional coding and block coding are two major forms of channel coding. Convolutional codes operate on a continuous input stream, one or a few bits at a time, which offer an alternative to block codes for transmission over a noisy channel.

A convolutional encoder is a Mealy machine, where the output is a function of the current machine state and the current input. In general, convolutional codes are described by two parameters: the coding rate and the constraint length. The coding rate, k/n, is expressed as a ratio of the number of bits into the convolutional encoder (k) to the number of channel symbols output by the convolutional encoder (n) in a given encoder cycle. The constraint length, K, denotes the "length" of the convolutional encoder, i.e., how many k-bit stages are available to feed the combinational logic that produces the output symbols.

In 1967, Andrew J. Viterbi introduced a decoding algorithm for convolutional codes which has become known as the Viterbi algorithm. The Viterbi algorithm is defined in terms of a graph which is called a trellis diagram. A trellis diagram is a 2-dimensional array of nodes that are connected with arcs, namely branches. Each column in the array contains $2^{K-1}$ nodes which represent the $2^{K-1}$ states of the convolutional encoder. In each stage of the encoding procedure, the encoder receives a k-bit symbol, outputs an n-bit symbol based on its current state and the input symbol, and enters a new state which is a function of its current state and the input symbol. An arc in the trellis diagram from row p in column i to row u in column i+1 corresponds to the encoder going from state p at instant i of the encoding procedure to state u at instant i+1. When applied to a sequence of symbols received from a memory-less channel, in an iterative manner, the Viterbi algorithm finds the maximum likelihood path through the trellis diagram and thereby outputs the decoded data.

Viterbi decoding has been the subject of several U.S. patents including U.S. Pat. No. 5,878,060, U.S. Pat. No. 5,912,908, and U.S. Pat. No. 6,415,415. An advantage of the Viterbi decoding is the fixed decoding time. The Viterbi algorithm is well suited to hardware decoder implementation, but its computational requirements grow exponentially as a function of the constraint length. Traditionally, performance and silicon area are the two most important concerns in VLSI design. In recent years, power dissipation has also become an important concern, especially in battery-powered applications, such as cellular phones, laptop computers, and WLAN adapters. Compared with a K=5 convolutional code for use in GSM systems, the convolutional code specified in the IEEE 802.11a/g standard has a constraint length of K=7. As the constraint length increases, the decoding process in the receiver becomes increasingly complicated and consumes more power. Several studies have shown that the Viterbi decoder consumes more than one-third of the chip area and the power dissipation of the baseband modem. Consequently, it is necessary to address the issues of low-power design for the Viterbi decoder.

SUMMARY OF THE INVENTION

These and other drawbacks in the related art are overcome in large part by a Viterbi decoder according to the present invention. In particular, a survivor path decoding apparatus is disclosed for use in a Viterbi decoder with a constraint length of K. According to one aspect of the invention, the apparatus of the invention is made up of a best survivor unit and a survivor memory. The best survivor unit receives path metrics of $2^{K-2}$ local winner states from which a best state is selected every L iterations. The local winner states are pre-chosen from $2^{K-2}$ pairs of odd and even states, respectively. These pairs of odd and even states are divided from $2^{K-1}$ trellis states. Preferably, the best survivor unit comprises γ 2-to-1 comparators for choosing the best state among the local winner states by comparing $2^{K-2}$ path metrics of the local winner states in L−1 iterations. The survivor memory includes a register-exchange network and a trace-back unit. The register-exchange network receives decision bits of the $2^{K-1}$ states and generates decision vectors of survivor paths leading to all states at instant i according to the decision bits of all states from instant i−L to instant i. Every L iterations the decision vectors are output for the $2^{K-1}$ states, where each decision vector has a length of L bits. Then the trace-back unit stores the decision vectors of the $2^{K-1}$ states and finds a global survivor path sequence by following the decision vectors back from the best state at instant i−L. In this manner, L decoded bits can be output from the trace-back unit every L iterations.

According to another aspect of the invention, a rate 1/n Viterbi decoder with a constraint length of K is disclosed. The Viterbi decoder of the invention is composed of a branch metric generator, an add-compare-select module, a best survivor unit, and a survivor memory. The branch metric generator is used to compute a plurality of branch metrics each of which is a distance between a corresponding branch label and a currently received data symbol including n decision metrics. In response to the branch metrics, the add-compare-select module can generate decision bits of $2^{K-1}$ states along with path metrics of $2^{K-2}$ local winner states. Note that all of the states are divided into $2^{K-2}$ pairs of odd and even states and the $2^{K-2}$ local winner states are selected from the odd and even state pairs, respectively. The best survivor unit receives the path metrics of the $2^{K-2}$ local winner states and selects a best state from among the $2^{K-2}$ local winner states every L iterations. The survivor memory is made up of a register-exchange network and a trace-back unit. The register-exchange network receives the decision bits of all states from the add-compare-select module. According to the decision bits of the $2^{K-1}$ states from instant i−L to instant i, decision vectors of survivor paths leading to the $2^{K-1}$ states at instant i can be generated every L iterations, where each of the decision vectors has a length of L bits. The trace-back unit stores the decision vectors of the $2^{K-1}$ states and finds a global survivor path sequence by following the decision vectors back from the best state at instant i−L. In this manner, L decoded bits can be output from the trace-back unit every L iterations.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

The present invention will now be described with reference to a wireless communication system that conforms to the IEEE 802.11/g standard. According to the invention, the communication system need not be wireless and the conformant 802.11a/g transceiver referred to herein is merely an exemplary illustration. In the example of a conformant 802.11a/g transceiver, the convolutional encoder generates two output bits for every input bit using a code with a constraint length K=7. Therefore, its Viterbi decoder has a coding rate k/n equal to ½. The constraint length K=7 means that there are $2^{7-1}$=64 states of the encoder (since the seventh bit is the input bit). These states are designated as state $S_0$ (decimal 0, binary 000000) to state $S_{63}$ (decimal 63, binary 111111). The IEEE 802.11a/g standard adopts puncturing technique to achieve higher data rate. Puncturing is a bit-stealing procedure for omitting some of encoded bits in the transmitter, thereby reducing the number of transmitted bits and increasing the coding rate. For example, if a bit sequence of $A_1 B_1 A_2 B_2$ has the bit $B_2$ omitted, it becomes $A_1 B_1 A_2$ p where p denotes the punctured bit. Instead of transmitting four encoded bits to represent two bits of data (coding rate R=2/4 or ½), three bits are transmitted now to represent the same two bits of data for R=2/3. A rate R=3/4 can be generated in a similar manner.

Figure 1:
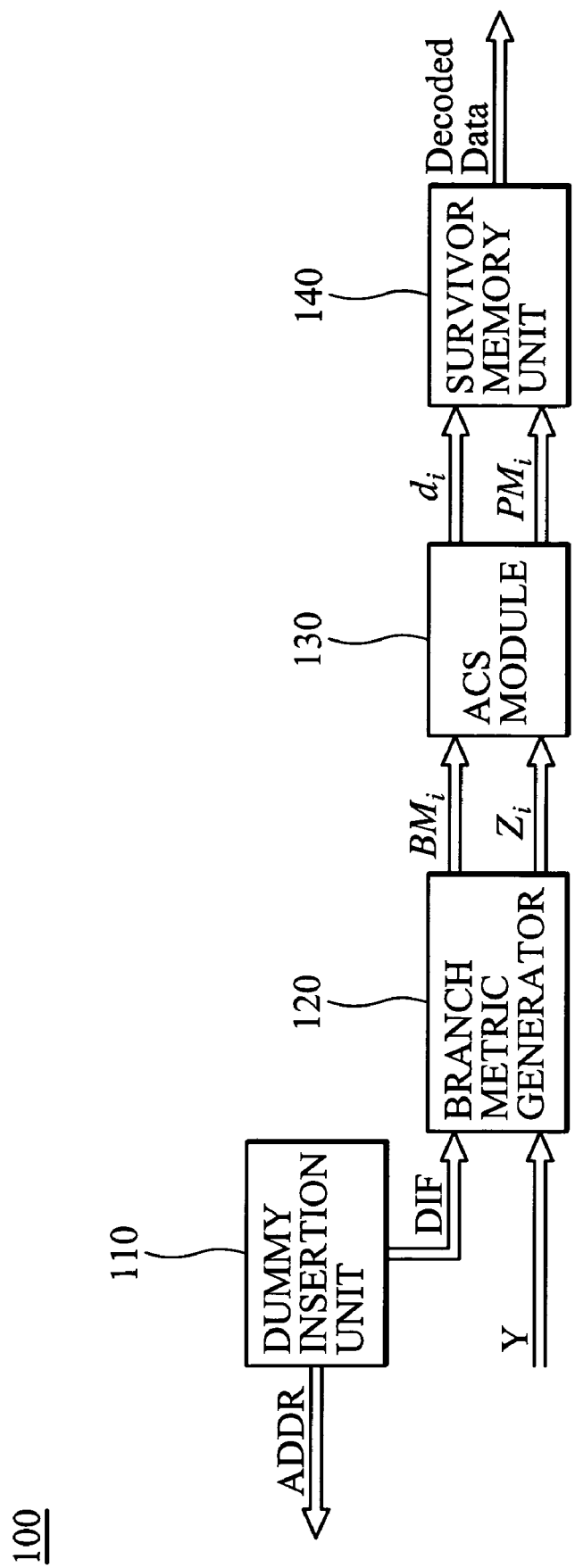
FIG. 1 is a block diagram of a Viterbi decoder according to an embodiment of the invention.

Referring to FIG. 1, a rate 1/n Viterbi decoder with a constraint length of K according to an embodiment of the invention is illustrated and identified by the reference numeral 100. The Viterbi decoder 100 has four main blocks including a dummy insertion unit 110, a branch metric generator 120, an add-compare-select (ACS) module 130, and a survivor memory unit 140. The dummy insertion unit 110 is responsible for inserting dummy data into the Viterbi decoder 100 on the receive side in place of the previously punctured bits. It performs a dummy insertion procedure inverse to the bit-stealing procedure according to a puncturing pattern (i.e., the coding rate). In this regard, the dummy insertion unit 110 retrieves a sequence of decision metrics from a buffer in the preceding module by generating two column addresses, ADDR0 and ADDR1, where the decision metrics are arranged in order of time received and the earliest one is in address 0. The preceding module can deliver either hard-decision or soft-decision values to the Viterbi decoder 100. If the decision metrics are quantized to one-bit precision, the result is called hard-decision data. If the decision metrics are quantized with more than one bit of precision, the result is called soft-decision data. In the case of the conformant 802.11a/g receiver, the dummy insertion procedure can be classified into three operating modes and represented by way of the following expression:

```
Mode 0 (coding rate R = 1/2)

for (count = 0; count++; count < N_DBPS)
    {
        ADDR0 = count × 2;
        ADDR1 = count × 2 + 1;
    }
Mode 1 (coding rate R = 2/3)

for (count = 0; count++; count < N_DBPS)
    {
        if((count mod 2) == 0)
        {
            ADDR0 = count × 3/2;
            ADDR1 = count × 3/2 + 1;
        }
        if((count mod 2) == 1)
        {
            ADDR0 = (count − 1) × 3/2 + 2;
            /* insert a dummy value, ADDR1: don't care */
        }
    }
Mode 2 (coding rate R = 3/4)

for (count = 0; count++; count < N_DBPS)
    {
        if((count mod 3) == 0)
        {
            ADDR0 = count × 4/3;
            ADDR1 = count × 4/3 + 1;
        }
        if((count mod 3) == 1)
        {
            ADDR0 = (count − 1) × 4/3 + 2;
            /* insert a dummy value, ADDR1: don't care */
        }
        if((count mod 3) == 2)
        {
            /* insert a dummy value, ADDR0: don't care */
            ADDR1 = (count − 2) × 4/3 + 3;
        }
    }
```

Note that a cycle-based counter, count, is built in the dummy insertion unit 110 to generate the count from 0 to $N_{DBPS}$−1, where $N_{DBPS}$ is the number of data bits per OFDM symbol. Furthermore, the dummy insertion unit 110 outputs a dummy insertion flag, DIF, to indicate a position at which a dummy value is inserted into a sequence of decision metrics. Using the column addresses ADDR0 and ADDR1, $N_{CBPS}$ decision metrics are retrieved in $N_{DBPS}$ clock cycles according to the puncturing pattern, where $N_{CBPS}$ is the number of coded bits in an OFDM symbol. After retrieving $N_{CBPS}$ decision metrics, the operation of the dummy insertion unit 110 is suspended and the built-in counter is reset to zero.

The branch metric generator 120 accepts the dummy insertion flag DIF and a sequence Y at its inputs as shown in FIG. 1. For example, the sequence Y can be formed with the appropriately inserted dummy values and the retrieved decision metrics that are soft-decision values in Q-bit representation. Every group of n values in the sequence Y is organized into a data symbol $y_i$. It should be understood to those skilled in the art that 1-bit hard-decision values may also substitute for the exemplificative soft-decision values. The branch metric generator 120 is responsible for branch metric computation which provides a measurement. Such a measurement, referred to as the branch metric, is an inverse of the likelihood that a given branch from a current state to a next state is correct. For a rate 1/n Viterbi decoder, there are two possible state transitions and thus two branch metrics are calculated for each next state by measuring the difference between the received data symbol at a given instant and two associated branch labels. A branch label on a given branch specifies which value the encoder output. Although there are 64 encoder states for 802.11a/g, a total of four branch metrics are calculated for each data symbol $y_i$ because the rate ½ encoder can only output a symbol having a maximum of four possible values. Considering the dummy insertion, the branch metric generator 120 ignores the appropriately inserted dummy values in response to the dummy insertion flag when calculating the branch metrics. In FIG. 1, the branch metrics generated at instant i by the branch metric generator 120 are referred to as $BM_i$. More particularly, a branch metric of a transition from state S' to state S at instant i is denoted by $BM_i^{(S',S)}$. According to the invention, the branch metric generator 120 further pre-calculates a branch metric difference $Z_i$ for the subsequent add-compare-select operation, which will be described in detail later.

Figure 2:
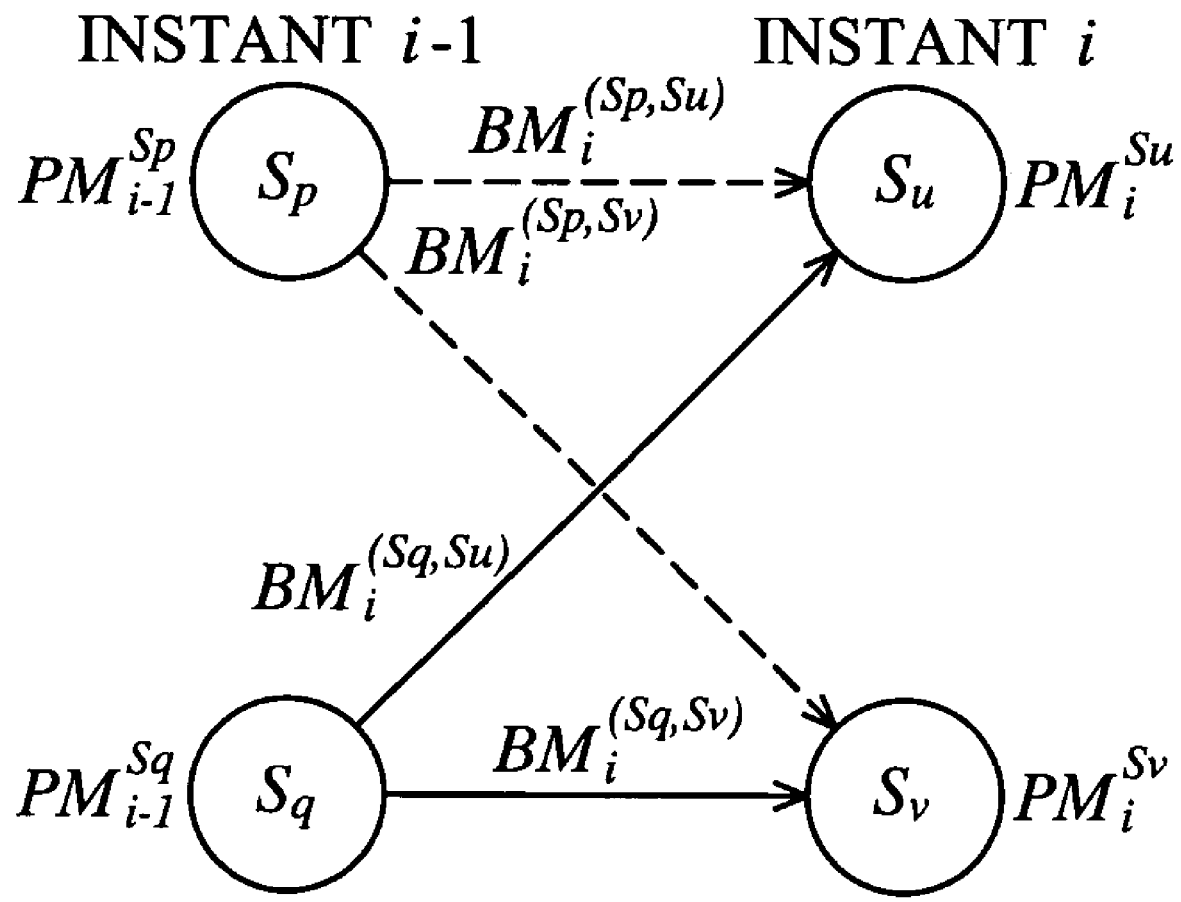
FIG. 2 is a graph showing a basic unit of the butterfly trellis structure.

Still referring to FIG. 1, the ACS module 130 receives the output of the branch metric generator 120 and generates a path metric $PM_i$ and a decision bit $d_i$ for each next state. According to the invention, the trellis diagram for the rate 1/n encoder with a constraint length of K is organized in a butterfly structure. FIG. 2 shows a basic element of the butterfly trellis structure. Four possible state transitions from instant i to instant i−1 are illustrated. The following relations shown in FIG. 2 are established for a rate 1/n, constraint length K Viterbi decoder:

$$p=0, 1, 2, \ldots, 2^{K-2}-1$$

$$q=2^{K-2}+p$$

$$u=2p$$

$$v=2p+1$$

$$PM_i^{S_u}=\min(PM_{i-1}^{S_p}+BM_i^{(S_p,S_u)}, PM_{i-1}^{S_q}+BM_i^{(S_q,S_u)})$$

$$PM_i^{S_v}=\min(PM_{i-1}^{S_p}+BM_i^{(S_p,S_v)}, PM_{i-1}^{S_q}+BM_i^{(S_q,S_v)})$$

Here $PM_i^S$ denotes a path metric of the survivor path entering state S at instant i. It is important to note that u is even and v is odd. This implies that an odd (even) state is reached only if the source input bit is '1' ('0'). In other words, state $S_u$ can be reached from either state $S_p$ or $S_q$ when the source input bit is '0'. Similarly, state $S_v$ can be reached from either state $S_p$ or $S_q$ when the source input bit is '1'. In Viterbi decoding, the decision bit indicates which sum of a source path metric and a branch metric generated the smallest result and was selected as a new path metric. If the decision bit of a state at instant i is '0', the associated upper branch (the dashed line in FIG. 2) is the survivor path leading to a predecessor state. If it is '1', the lower branch (the solid line in FIG. 2) will be chosen.

One important property of the convolutional code specified in IEEE 802.11a/g is that $BM_i^{(S_p,S_u)}=BM_i^{(S_q,S_v)}$ and $BM_i^{(S_p,S_v)}=BM_i^{(S_q,S_u)}$. This property can be applied to jointly calculate the path metrics $PM_i^{S_u}$ and $PM_i^{S_v}$. For calculating $PM_i^{S_u}$, instead of finding the minimum between $PM_{i-1}^{S_p}+BM_i^{(S_p,S_u)}$ and $PM_{i-1}^{S_q}+BM_i^{(S_q,S_u)}$, the values of $W_i=PM_{i-1}^{S_p}-PM_{i-1}^{S_q}$ and $Z_i=BM_i^{(S_q,S_u)}-BM_i^{(S_p,S_u)}$ are compared. If $W_i<Z_i$, it means $PM_{i-1}^{S_p}+BM_i^{(S_p,S_u)}<PM_{i-1}^{S_q}+BM_i^{(S_q,S_u)}$, and vice versa. Now for calculating $PM_i^{S_v}$, the values of $W_i=PM_{i-1}^{S_p}-PM_{i-1}^{S_q}$ and $-Z_i=BM_i^{(S_q,S_u)}-BM_i^{(S_p,S_u)}=BM_i^{(S_p,S_v)}-BM_i^{(S_q,S_v)}$ are compared, where $Z_i$ and $-Z_i$ are opposite numbers. As mentioned earlier, the branch metric difference $Z_i$ is pre-calculated in the branch metric generator 120 by subtracting $BM_i^{(S_p,S_u)}$ from $BM_i^{(S_q,S_u)}$. The other branch metric difference, $-Z_i$, can be obtained from the negative of $Z_i$. Note that both calculations of $PM_i^{S_u}$ and $PM_i^{S_v}$ share the term $W_i$, and thus one computation can be reduced. Also, the additions and subtractions are carried out with smaller bit-width. This results in lower complexity and power consumption.

Figure 3:
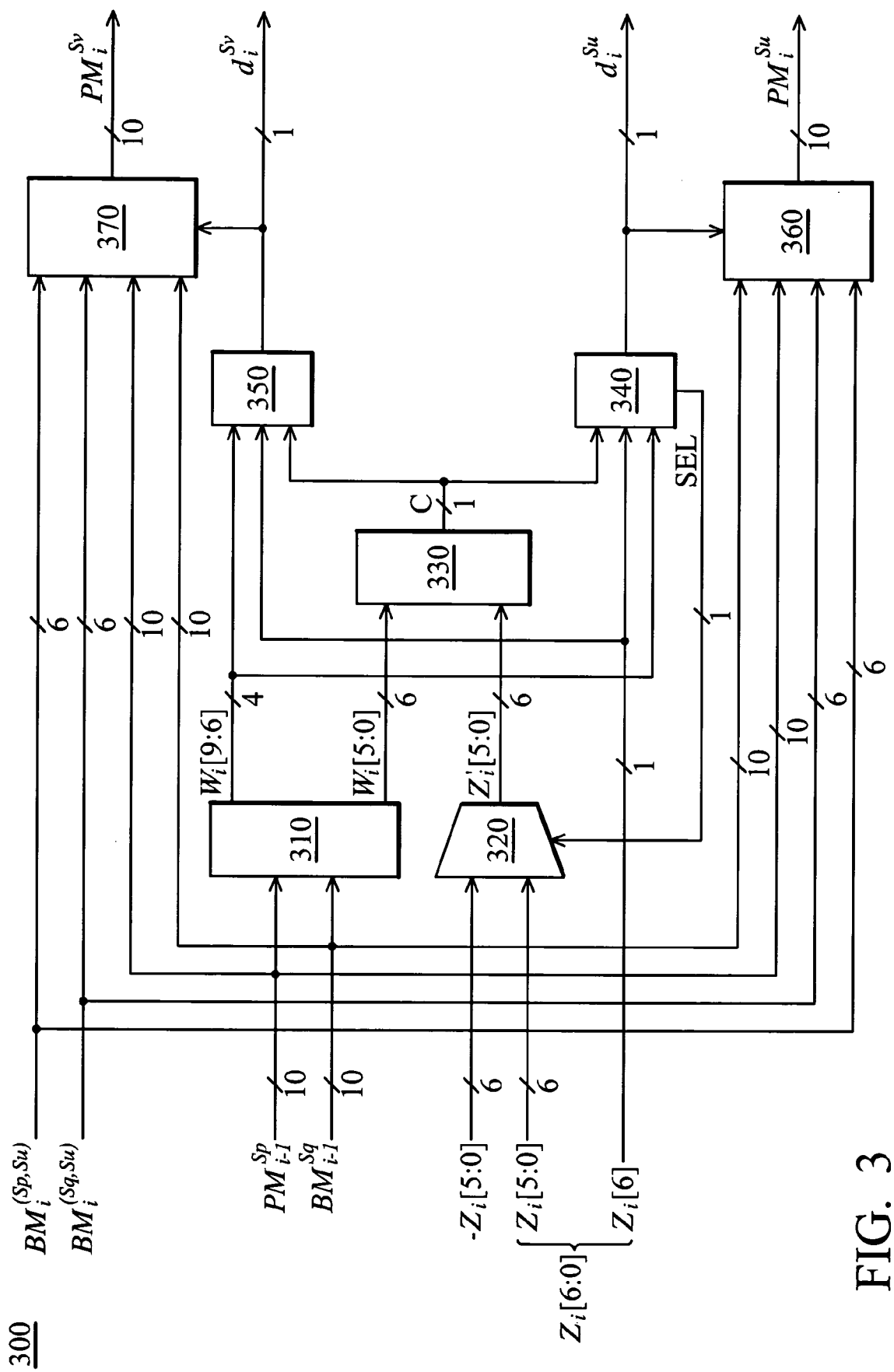
FIG. 3 is a block diagram of an add-compare-select unit according to an embodiment of the invention.

The ACS module 130 preferably comprises P number of ACS units each responsible for a basic butterfly element. The number of necessary ACS units is equal to half the number of total states, that is, $P=2^{K-2}$. FIG. 3 shows a detailed block diagram of the pth ACS unit in the ACS module 130. The pth ACS unit 300 is made up of a subtractor 310, a λ-bit multiplexer 320, a λ-bit unsigned comparator 330, two combinational-logic circuits 340 and 350, and two adding means 360 and 370. To begin with, the branch metrics are represented by λ bits of precision, in which λ is given by:

$$\lambda=Q+n-1$$

The number of bits required to represent the branch metric difference is $\beta=\lambda+1$. On the other hand, the path metrics are represented by α bits of precision and α is given by an equation of the form:

$$\alpha=1+\lceil \log_2(n \cdot k(2^Q-1)) \rceil$$

where $\lceil \cdot \rceil$ denotes a ceiling function which returns the smallest integer greater than or equal to the given numeric expression. For example, the decision metrics are quantized into 32 levels, i.e., they are represented by Q=5 bits of precision. In this case, α is 10, β is 7, and λ is 6 for a rate ½, K=7 Viterbi decoder (n=2). It should be understood that α, β, and λ stand for the optimums according to the present disclosure; they may also be replaced with other values, as will be appreciated by those skilled in the art. The subtractor 310 calculates the path metric difference $W_i$ by subtracting $PM_{i-1}^{S_q}$ from $PM_{i-1}^{S_p}$. The 6-bit multiplexer 320 selectively provides an output between 6 least significant bits (LSBs) of $Z_i$ and $-Z_i$ according to a select signal SEL. The 6-bit unsigned comparator 330 is used to generate a comparison result, C, by comparing the magnitude of 6 LSBs of the 10-bit path metric difference, $W_i[5:0]$, and the magnitude of the 6-bit multiplexer output, $Z'_i[5:0]$.

The combinational-logic circuits 340 and 350 are responsible for logically operating δ most significant bits (MSBs) of the α-bit path metric difference, the comparison result C, and a sign bit of the branch metric difference at instant i, where $\delta=\alpha-\lambda$. In the case of a rate ½, K=7 Viterbi decoder, 4 MSBs of the 10-bit path metric difference, $W_i[9:6]$, are applied to the combinational-logic circuits 340 and 350 both. As shown in FIG. 3, the comparison result C and the sign bit of the 7-bit branch metric difference, $Z_i[6]$, are applied to the combinational-logic circuits 340 and 350 as well. According to the invention, the combinational-logic circuit 340 is capable of predetermining whether the magnitude of the path metric difference is greater or less than that of the branch metric difference based on $W_i[9:6]$ and $Z_i[6]$. If the predetermination is met, i.e., it gives a decisive answer, a decision bit, $d_i^{S_u}$, can be set for state $S_u$ at instant i based on the predetermination; otherwise, $d_i^{S_u}$ is set to be consistent with the comparison result C. On the other hand, the combinational-logic circuit 350 is capable of predetermining whether the magnitude of the path metric difference is greater or less than that of the negative of the branch metric difference based on $W_i[9:6]$ and $Z_i[6]$. If so, a decision bit, $d_i^{S_v}$, can be set for state $S_v$ at instant i based on this predetermination. Provided that the predetermination is not met, i.e., it cannot give a decisive answer, $d_i^{S_v}$ is set to be consistent with the comparison result C.

Figure 4A:
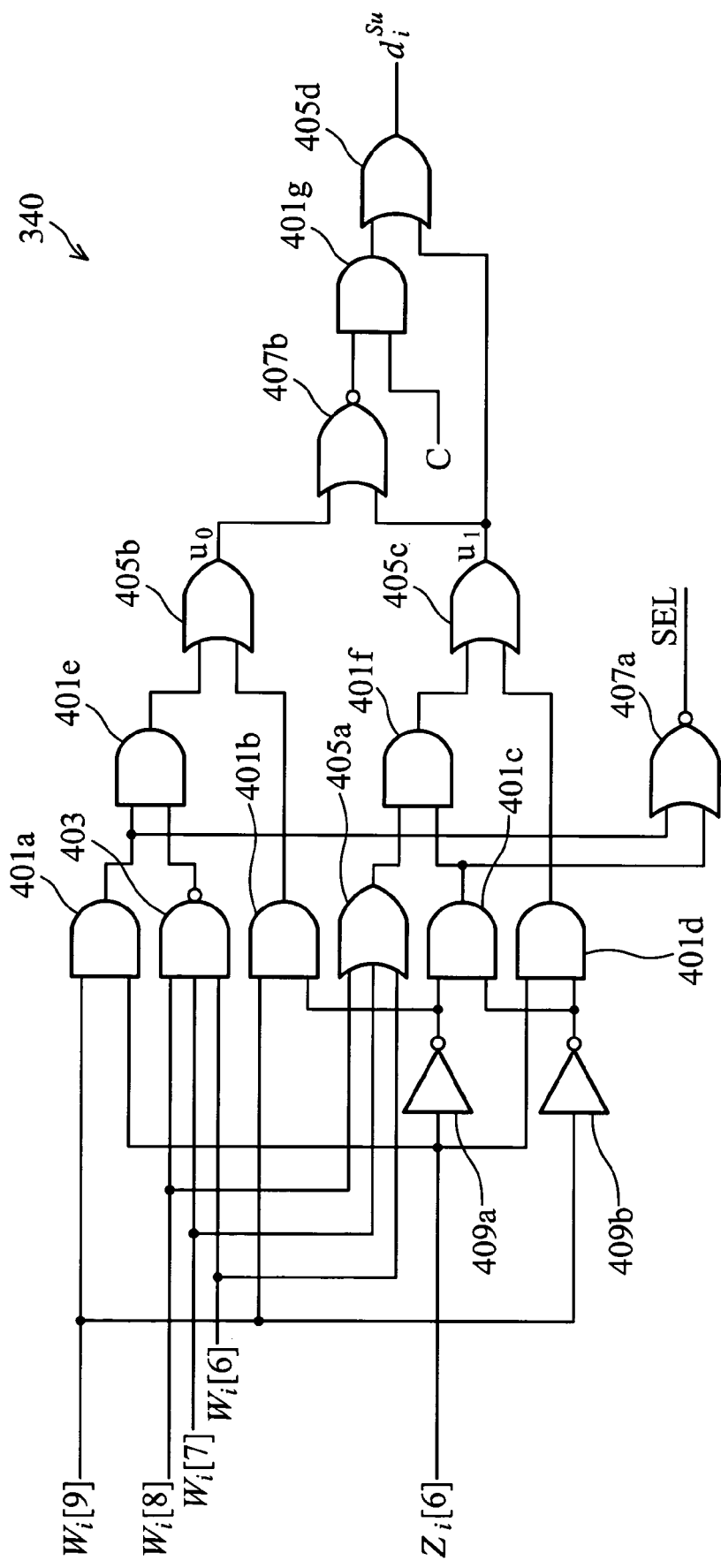
FIG. 4A is a logic diagram of a first combinational-logic circuit according an embodiment of the invention.

Referring to FIG. 4A, a logic diagram of the combinational-logic circuit 340 according to an embodiment of the invention is illustrated. It is seen that the combinational-logic circuit 340 is implemented with AND gates 401a-g, NAND gate 403, OR gates 405a-d, NOR gates 407a-b, and NOT gates 409a-b. The logic diagram of FIG. 4A can be summarized by the following Boolean expressions:

$$u_0 = W_i[9] \cdot \overline{Z_i[6]} + ((W_i[9] \cdot Z_i[6]) \cdot (\overline{W_i[8] \cdot W_i[7] \cdot W_i[6]}))$$

$$u_1 = \overline{W_i[9]} \cdot Z_i[6] + ((\overline{W_i[9] \cdot Z_i[6]}) \cdot (W_i[8] + W_i[7] + W_i[6]))$$

$$d_i^{S_u} = u_1 + (C \cdot (\overline{u_0 + u_1}))$$

$$SEL = \overline{W_i[9] \cdot Z_i[6]} + \overline{W_i[9] \cdot Z_i[6]}$$

Figure 4B:
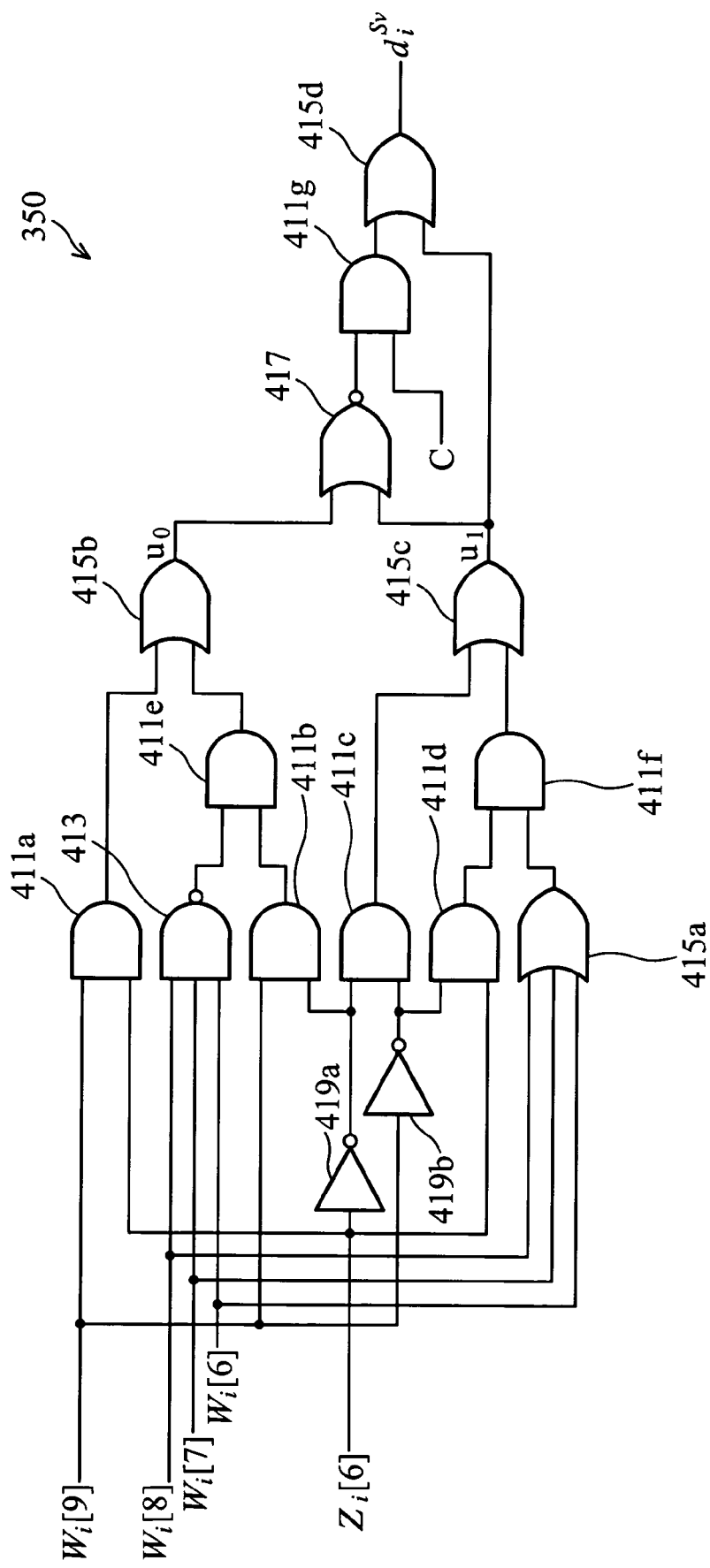
FIG. 4B is a logic diagram of a second combinational-logic circuit according an embodiment of the invention.

As such, $W_i[9:6]$ and $Z_i[6]$ are used to predetermine the magnitude comparison between $W_i$ and $Z_i$. When the predetermination is met, i.e., either $u_0$ or $u_1$ is '1', the comparison result C from the 6-bit unsigned comparator 330 is disabled by the AND gate 401g. As a result, $d_i^{S_u}$ follows the value of $u_1$. In this case, the decision bit can be set for state $S_u$ at instant i based on the predetermination. Conversely, both $u_0$ and $u_1$ become '0' when $W_i$ and $Z_i$ have the same sign and $W_i[8:6]$ cannot give additional information about the magnitude comparison. Therefore, the predetermination is not met and the comparison result C is enabled to set $d_i^{S_u}$. Note that the select signal SEL is '0' when $W_i$ and $Z_i$ both have the same sign. Accordingly, the 6-bit multiplexer 320 selects $Z_i[5:0]$ for the 6-bit comparator 330 so that the comparison result C is generated irrespective of the sign by comparing the magnitude of $W_i[5:0]$ and $Z_i[5:0]$. Similarly, a logic diagram of the combinational-logic circuit 350 according to an embodiment of the invention is illustrated in FIG. 4B. As depicted, the combinational-logic circuit 350 is implemented with AND gates 411a-g, NAND gate 413, OR gates 415a-d, NOR gate 417, and NOT gates 419a-b. The Boolean expressions for the logic diagram of FIG. 4B are described as follows:

$$v_0 = W_i[9] \cdot \overline{Z_i[6]} + ((W_i[9] \cdot \overline{Z_i[6]})(\overline{W_i[8] \cdot W_i[7] \cdot W_i[6]}))$$

$$v_1 = \overline{W_i[9]} \cdot Z_i[6] + ((\overline{W_i[9]} \cdot Z_i[6])(W_i[8] + W_i[7] + W_i[6]))$$

$$d_i^{S_v} = v_1 + (C \cdot (\overline{v_0 + v_1}))$$

Also, $W_i[9:6]$ and $Z_i[6]$ are used to predetermine the magnitude comparison between $W_i$ and $-Z_i$. When the predetermination is met, i.e., either $v_0$ or $v_1$ is '1', the comparison result C is disabled by the AND gate 411g so that $d_i^{S_u}$ follows the value of $u_1$. On the other hand, both $v_0$ and $v_1$ become '0' when $W_i$ and $-Z_i$ have the same sign and $W_i[8:6]$ cannot give additional information about the magnitude comparison. Therefore, the predetermination is not met and the comparison result C is enabled to set $d_i^{S_v}$. Note that the select signal SEL is '1' when $W_i$ and $-Z_i$ both have the same sign. Accordingly, the 6-bit multiplexer 320 selects $-Z_i[5:0]$ as the input to the 6-bit comparator 330 so that the comparison result C is generated irrespective of the sign by comparing the magnitude of $W_i[5:0]$ and $-Z_i[5:0]$. It should be appreciated by those skilled in the art that either the combinational-logic circuit 340 or 350 is contemplated to provide the select signal SEL by the principles of the invention.

In light of the foregoing description, it is shown that the combinational-logic circuits 340 and 350 can reduce the number of comparisons required during the ACS operation. If necessary, AND gates 401a-d, NAND gate 403, OR gate 405a, and NOT gate 409a-b are shared between the combinational-logic circuits 340 and 350 to reduce circuit complexity. With the 6-bit multiplexer 320, the 6-bit unsigned comparator 330 is capable of serving $Z_i[5:0]$ and $-Z_i[5:0]$ one at a time. This is because $W_i$ and $Z_i$ are the same sign while $W_i$ and $-Z_i$ have opposite signs, and vice versa. By sharing the 6-bit unsigned comparator 330 between even state $S_u$ and odd state $S_v$, further reduction in complexity and power dissipation can be accomplished. For IEEE 802.11a/g, this sharing can save a Viterbi decoder up to 32 unsigned comparators.

Turning back to FIG. 3, the adding means 360 can calculate $PM_i^{S_u}$ by selectively adding $PM_{i-1}^{S_q}$ and $BM_i^{(S_q, S_u)}$ or adding $PM_{i-1}^{S_p}$ and $BM_i^{(S_p, S_u)}$ according to $d_i^{S_u}$. Likewise, the adding means 370 can calculate $PM_i^{S_v}$ by selectively adding $PM_{i-1}^{S_q}$ and $BM_i^{(S_p, S_u)}$ or adding $PM_{i-1}^{S_p}$ and $BM_i^{(S_q, S_u)}$ according to $d_i^{S_v}$. In addition, use of the best-state decoding strategy locates the state having the smallest path metric. Typically, this can be done by comparing the path metrics of all states with subtractions. According to the invention, the unique architecture of the pth ACS unit 300 lends itself to pre-compare $PM_i^{S_u}$ and $PM_i^{S_v}$ without subtractions, whereby a saving of half the output number of path metrics at instant i can be achieved. This pre-comparison also enables the subsequent survivor memory unit 140 to gain significant reduction in latency, circuit complexity, and power consumption. In this regard, the pth ACS unit 300 preferably comprises means for predetermining a local winner state between states $S_u$ and $S_v$ at instant i based on $d_i^{S_u}$, $d_i^{S_v}$, and the sign of $W_i$ or $Z_1$. The method for predetermining a local winner state is described as follows:

Case 1: $d_i^{S_u} = 0$ and $d_i^{S_v} = 1$

If $W_i \geqq 0$, the local winner state is $S_v$; otherwise, the local winner state is $S_u$.

Case 2: $d_i^{S_u} = 1$ and $d_i^{S_v} = 0$

If $W_i > 0$, the local winner state is $S_u$; otherwise, the local winner state is $S_v$.

Case 3: $d_i^{S_u} = 0$ and $d_i^{S_v} = 0$

If $Z_i > 0$, the local winner state is $S_u$; otherwise, the local winner state is $S_v$.

Case 4: $d_i^{S_u} = 1$ and $d_i^{S_v} = 1$

If $Z_i \geqq 0$, the local winner state is $S_v$; otherwise, the local winner state is $S_u$.

As a result, every iteration the ACS module 130 sends current decision bits of 64 ($2^{K-1}$) states and current path metrics of 32 ($2^{K-2}$) local winner states to survivor memory unit 140.

Figure 5:
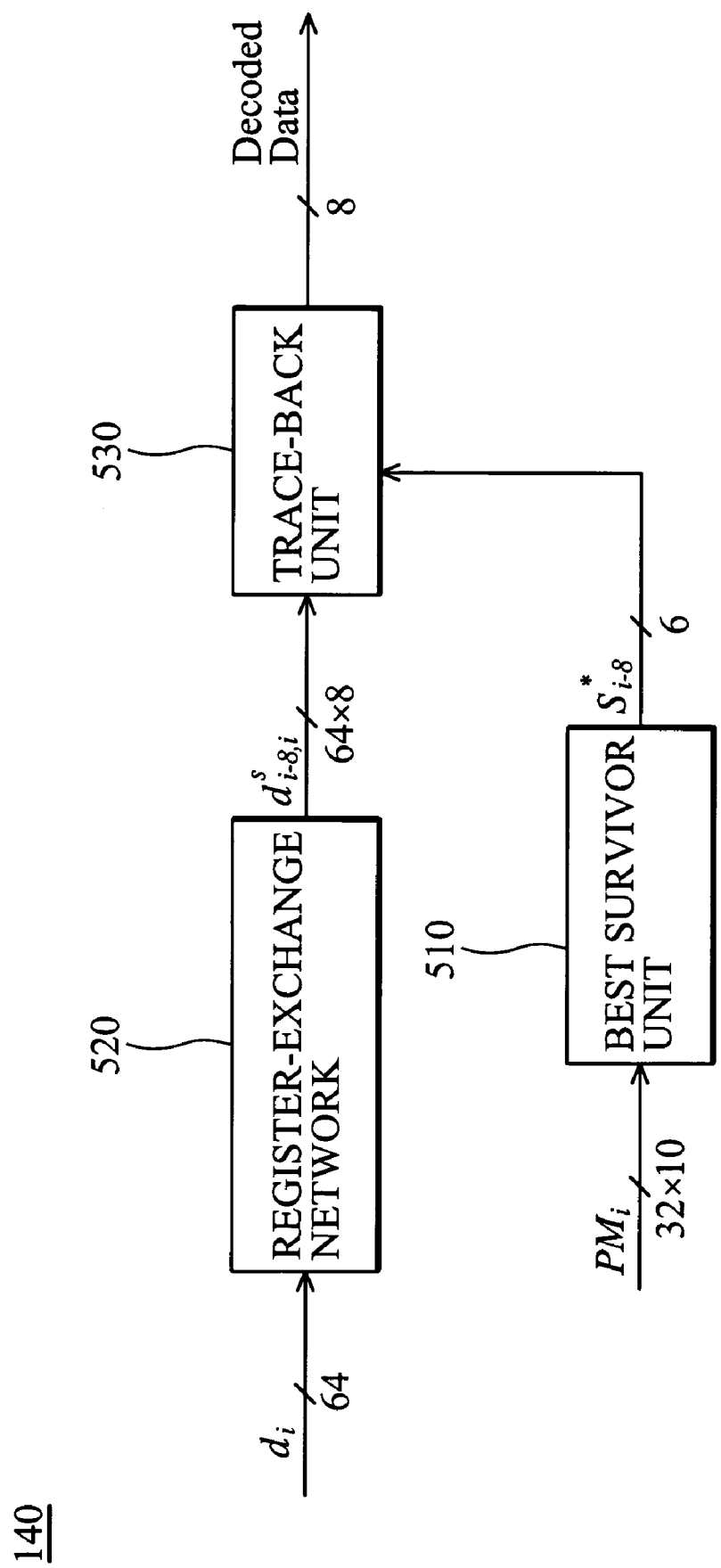
FIG. 5 is a detailed block diagram illustrating a survivor memory unit of FIG. 1 according to the invention.

The survivor memory unit 140 is a type of survivor path decoder. Referring to FIG. 5, the survivor memory unit 140 is constituted by a best survivor unit 510, a register-exchange network 520, and a trace-back unit 530. The best survivor unit 510 simultaneously receives the path metrics of 32 ($2^{K-2}$) local winner states at consecutive time instants from the ACS module 130. As stated above, each local winner state is chosen from a pair of odd and even states. Due to the elaborate design of the invention, the best survivor unit 510 needs to find a best state with the smallest path metric only once every L iterations, where the number of L is equal to a divisible factor of a data payload length for a conformant 802.11a/g system. In one embodiment, L is equal to 8. The best survivor unit 510 includes γ 2-to-1 comparators for choosing the best state among the 32 local winner states by comparing 32 path metrics of the local winner states in 7 (L−1) iterations, leaving the 8th iteration for the best state latching into the trace-back unit 530. The number of 2-to-1 comparators, γ, is given by:

$$\gamma = \left\lceil \frac{2^{K-2}-1}{L-1} \right\rceil$$

Therefore, γ is 5 for the conformant 802.11a/g system. In 7 ACS iterations, each of the 2-to-1 comparators is used to compare two out of 32 path metrics to find the minimum path metric among the 32 local winner states. Hence, the state associated with the minimum path metric is selected as the best state, $S^*_{i-8}$.

As depicted, the register-exchange network 520 receives the decision bits of 64 ($2^{K-1}$) states from the ACS module 130. In the register-exchange network 520, associated with every state is a register which contains the survivor path leading to that state. Each survivor path is uniquely specified by and stored as a sequence of decision bits along the survivor path. According to the decision bits from instant i−L (L=8) to instant i, decision vectors of survivor paths leading to the 64 states at instant i can be generated, respectively. For example, a decision vector of the survivor path to state S from instant i−L to i is given by the recursive update $$d_{i-L,i}^S = (d_{i-1-L,i-1}^{S'} << 1 + d_i^S)[L-1:0]$$

where S' is the predecessor state of S as determined by its decision bit $d_i^S$ from the ACS operation. The current state decision $d_i^S$ is is used to select the predecessor state decision vector which is left shifted to allow $d_i^S$ to be appended to the vector. This update occurs concurrently for all states, hence the name register-exchange, since each update corresponds to an exchange of the register contents modulo the shift and append. If L=8; the above expression is rewritten as:

$$d_{i-8,i}^S = (d_{i-9,i-1}^{S'} << 1 + d_i^S)[7:0]$$

where the decision vector $d_{i-8,i}^S$ has a length of 8 (L) bits.

The trace-back unit 530 utilizes a backward processing algorithm for survivor path update and decode. Such an algorithm requires the decision bits to be stored in a memory prior to tracing back the survivor path. In general, the trace-back recursion estimates the previous state $S_{i-1}$ given the current state $S_i$ as the following update $$S_{i-1} = ((d_i^S << (K-1) + S_i) >> 1)[K-2:0]$$

which corresponds to 1-bit right shift of the current state register with input equal to the current state decision $d_i^S$. According to the invention, the trace-back recursion from instant i to i−L can be collapsed in a single trace-back recursion of the form $$S_{i-L} = ((d_{i-L,i}^S << (K-1) + S_i) >> L)[K-2:0]$$

If L=8 and K=7; the above expression can be rewritten as:

$$S_{i-8} = ((d_{i-8,i}^S << 6 + S_i) >> 8)[5:0] = d_{i-8,i}^S[7:2]$$

which means that the predecessor state at instant i−8 is determined by 6 MSBs of the survivor path sequence from the state S at instant i, $d_{i-8,i}^S[7:2]$. As described earlier, the register-exchange network 520 of length L is capable of calculating the survivor path sequence from instant i−L to i for each state (i.e., the decision vector $d_{i-8,i}^S$) prior to trace-back. Using this pretrace-back technique, the trace-back recursion iterates from instant i to i−L in a single trace-back operation. Accordingly, every 8 (L) iterations the best state and the decision vectors of all states are fed to the trace-back unit 530. Then the trace-back unit 530 stores the decision vectors of the 64 states and finds a global survivor path sequence by following the decision vectors back from the best state at instant i−8, $S^*_{i-8}$. In this manner, 8 decoded bits are output from the trace-back unit 530 every 8 iterations. More particularly, the novel design of the survivor memory unit 140 reduces the required chip area and power consumption compared to conventional techniques.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A survivor path decoding apparatus for a Viterbi decoder with a constraint length of K, comprising:
   a best survivor unit for receiving path metrics of $2^{K-2}$ local winner states from which a best state is selected every L iterations_said local winner states are chosen from $2^{K-2}$ pairs of odd and even states, respectively; and
   a survivor memory comprising:
      a register-exchange network for receiving decision bits of $2^{K-1}$ states and generating decision vectors of survivor paths leading to said $2^{K-1}$ states at instant i according to said decision bits of said $2^{K-1}$ states from instant i−L to instant i, wherein said $2^{K-1}$ states are divided into said $2^{K-2}$ pairs of odd and even states, said decision vectors of said $2^{K-1}$ states are output every L iterations, and each of said decision vectors has a length of L bits; and
      a trace-back unit for storing said decision vectors of said $2^{K-1}$ states and finding a global survivor path sequence by following said decision vectors back from the best state at instant i−L, such that L decoded bits are output every L iterations.

2. The apparatus as recited in claim 1 wherein said best survivor unit comprises γ 2-to-1 comparators for choosing the best state among said $2^{K-2}$ local winner states by comparing said path metrics of said $2^{K-2}$ local winner states in L−1 iterations.

3. The apparatus as recited in claim 2 wherein the number of said 2-to-1 comparators, γ, is given by:

$$\gamma = \left\lceil \frac{2^{K-2}-1}{L-1} \right\rceil$$

where ⌈·⌉ denotes a ceiling function.

4. The apparatus as recited in claim 1 wherein said number of L is equal to a divisible factor of a data payload length for a conformant 802.11g system.

5. The apparatus as recited in claim 4 wherein said number of L is equal to 8 for said conformant 802.11g system.

6. The apparatus as recited in claim 1 wherein said survivor memory features a decoding window length of Γ=L(L−2)+K −1.

7. A rate 1/n Viterbi decoder with a constraint length of K comprising:
   a branch metric generator for computing a plurality of branch metrics, each of which is a distance between a corresponding branch label and a currently received data symbol including n decision metrics;

an add-compare-select module, responsive to said branch metrics, for generating decision bits of $2^{K-1}$ states along with path metrics of $2^{K-2}$ local winner states, wherein said $2^{K-2}$ local winner states are selected from $2^{K-2}$ pairs of odd and even states, respectively, and said $2^{K-1}$ states are divided into said $2^{K-2}$ pairs of odd and even states;

a best survivor unit for receiving said path metrics of said $2^{K-2}$ local winner states from said add-compare-select module and selecting a best state from among said $2^{K-2}$ local winner states every L iterations; and a survivor memory comprising:
  a register-exchange network for receiving said decision bits of said $2^{K-1}$ states from said add-compare-select module and generating decision vectors of survivor paths leading to said $2^{K-1}$ states at instant i according to said decision bits of said $2^{K-1}$ states from instant i−L to instant i, wherein said decision vectors of said $2^{K-1}$ states are output every L iterations and each of said decision vectors has a length of L bits; and
  a trace-back unit for storing said decision vectors of said $2^{K-1}$ states and finding a global survivor path sequence by following said decision vectors back from the best state at instant i−L, such that L decoded bits are output every L iterations.

8. The Viterbi decoder as recited in claim 7 wherein said best survivor unit comprises γ 2-to-1 comparators for choosing the best state among said $2^{K-2}$ local winner states by comparing said path metrics of said $2^{K-2}$ local winner states in L−1 iterations.

9. The Viterbi decoder as recited in claim 8 wherein the number of said 2-to-1 comparators, γ, is given by:

$$\gamma = \left\lceil \frac{2^{K-2}-1}{L-1} \right\rceil$$

where $\lceil \cdot \rceil$ denotes a ceiling function.

10. The Viterbi decoder as recited in claim 7 wherein said number of L is equal to a divisible factor of a data payload length for a conformant 802.11g system.

11. The Viterbi decoder as recited in claim 10 wherein said number of L is equal to 8 for said conformant 802.11g system.

12. The Viterbi decoder as recited in claim 7 wherein said survivor memory features a decoding window length of Γ=L (L−2)+K−1.

13. The Viterbi decoder as recited in claim 7 wherein said decision metrics are hard-decision data if quantized to one-bit precision.

14. The Viterbi decoder as recited in claim 7 wherein said decision metrics are soft-decision data if quantized with more than one bit of precision.

* * * * *